United States Patent
Watanabe

[11] Patent Number: 6,165,860
[45] Date of Patent: Dec. 26, 2000

[54] SEMICONDUCTOR DEVICE WITH REDUCED PHOTOLITHOGRAPHY STEPS

[75] Inventor: Takeshi Watanabe, Tokyo, Japan

[73] Assignee: NEC Corporation, Tokyo, Japan

[21] Appl. No.: 09/368,529

[22] Filed: Aug. 5, 1999

Related U.S. Application Data

[62] Division of application No. 08/760,221, Dec. 4, 1996, Pat. No. 6,034,412.

[30] Foreign Application Priority Data

Dec. 6, 1995 [JP] Japan ................................ 7-344360

[51] Int. Cl.$^7$ .................................................. H01L 21/331
[52] U.S. Cl. ......................... 438/313; 438/205; 438/322; 438/327; 438/366
[58] Field of Search ..................... 438/170, 189, 438/202–205, 235, 312, 313, 309, 336, 366, 322, 327, 367; 257/565, 370, 378, 587, 588

[56] References Cited

U.S. PATENT DOCUMENTS

| | | | |
|---|---|---|---|
| 4,975,381 | 12/1990 | Taka et al. | 438/367 |
| 5,001,533 | 3/1991 | Yamaguchi | 257/515 |
| 5,010,026 | 4/1991 | Gomi | 257/565 |
| 5,204,276 | 4/1993 | Nakajima et al. | 438/366 |
| 5,374,846 | 12/1994 | Takemura | 257/592 |
| 5,508,553 | 4/1996 | Nakamura et al. | 257/576 |

FOREIGN PATENT DOCUMENTS

| | | |
|---|---|---|
| 0 297 335 | 1/1989 | European Pat. Off. . |
| 0 425 242 | 5/1991 | European Pat. Off. . |
| 39 40 394 | 6/1990 | Germany . |
| 4-361533 | 12/1992 | Japan . |
| 5-21719 | 1/1993 | Japan . |

*Primary Examiner*—Donald L. Monin, Jr.
*Assistant Examiner*—Hoai Pham
*Attorney, Agent, or Firm*—Sughrue, Mion, Zinn, Macpeak & Seas, PLLC

[57] ABSTRACT

There is provided a method of fabricating a semiconductor device, including the steps of, in sequence, (a) partially forming a buried layer in a semiconductor substrate and also forming an epitaxial layer on the buried layer, (b) forming a collector region in the epitaxial layer by selectively introducing impurities into the epitaxial layer so that the collector region reaches the buried layer, (c) forming an insulating film on the epitaxial layer, (d) forming a polysilicon film on the insulating film, (e) patterning the polysilicon film to form a base electrode, (f) forming an interlayer insulating film over the base electrode and the insulating film, (g) patterning both the interlayer insulating film and the base electrode to form a base opening at a region at which a base region is to be formed and a collector opening above the collector region, (h) side-etching portions of the insulating film located below the base electrode to form undercut hollow portions in the insulating film, (i) filling the undercut hollow portions with polysilicon, (j) forming a base region in the epitaxial layer by introducing impurities into the epitaxial layer through the base opening, (k) forming sidewalls on inner walls of the base collector openings, (l) forming an impurities doped polysilicon film over a resultant, and (m) patterning the polysilicon film to form an emitter electrode and the collector electrode. The method makes it possible decrease the number of photolithography steps by two relative to a conventional method.

10 Claims, 5 Drawing Sheets

SEMICONDUCTOR DEVICE WITH REDUCED PHOTOLITHOGRAPHY STEPS

This is a divisional of application Ser. No. 08/760,221 filed Dec. 4, 1996, now U.S. Pat. No. 6,034,412.

BACKGROUND OF THE INVENTION

1. Field of the Invention

The invention relates to a semiconductor device and a method of fabricating the same, and more particularly to a bipolar transistor to be fabricated in self-aligned fashion and a method of fabricating such a transistor.

2. Description of the Related Art

With LSI recently having been improved to have a higher performance, a bipolar transistor with a higher performance. In particular, a bipolar transistor with a higher operation rate is required. To accomplish such a request, it is material to reduce parasitic capacity and/or parasitic resistance in a bipolar transistor. Various self-align techniques have been proposed to do so, but these techniques simultaneously cause a method of fabricating a bipolar transistor to be more complicated and also cause the number of fabrication steps to increase.

Hereinbelow is explained a conventional method of fabricating a bipolar transistor in a self-aligned fashion, with reference to FIGS. 1A to 1F.

As illustrated in FIG. 1A, an n-type buried layer 2 is formed in a desired region in a p-type semiconductor substrate 14. An n-type epitaxial layer 1 is grown over the semiconductor substrate 14, and then, there are formed trench-type isolation regions 3 defining a region therebetween in which a semiconductor device is to be formed.

Then, there is deposited a silicon dioxide film 4 over the resultant; and an opening BE is formed in the silicon dioxide film 4 by means of photolithography at a region where a base and emitter are to be formed. Then, a silicon dioxide film 4a is formed within the opening BE. The silicon dioxide film 4a is thinner than the first formed silicon dioxide film 4. Then, an opening C is formed by means of photolithography at a region where a collector electrode is to be formed, as illustrated in FIG. 1B.

Then, the polysilicon film 5 is deposited all over a resultant structure by means of chemical vapor deposition (CVD), as illustrated in FIG. 1C. Then, ion implantation is carried out in selected regions by means of photolithography. Specifically, boron (B), one of p-type impurities, is implanted into a region where a base is to be formed, and phosphorus (P), one of n-type impurities, is implanted into a region where a collector electrode is to be formed, as illustrated in FIG. 1C. Then, photolithography and etching are carried out to thereby remove the polysilicon film 5 at regions other than regions where a base/emitter and a collector electrode are to be formed. Namely, the polysilicon film 5 now exists only at regions where a base/emitter and a collector electrode are to be formed. Then, the semiconductor substrate is thermally annealed to thereby make phosphorus contained in the polysilicon layer 5 diffuse into the n-type epitaxial layer 1 to the buried layer 2 in a region where a collector electrode is to be formed. Thus, a collector region 6 is formed, as illustrated in FIG. 1D.

Then, a silicon nitride film 7 is deposited over the resultant structure by means of CVD, and there is formed an opening 7a so that the thin silicon dioxide film 4a is exposed in a region where a base is to be formed, as illustrated in FIG. 1E. Then, an exposed portion of the thin silicon dioxide film 4a and a portion of the silicon dioxide film 4a located just below ends of the polysilicon film 5 are etched for removal with weak hydrofluoric acid to thereby form undercut hollow portions below the polysilicon film 5. Then, a polysilicon film 8 is deposited in the opening 7a by CVD so that the undercut hollow portions are filled therewith. Then, the thus deposited polysilicon film 8 is etched out so that the polysilicon film 8 exists only in the undercut hollow portions.

Then, boron ions are implanted into the epitaxial layer 1 through the opening 7a, followed by thermal annealing, to thereby form a base region 11 in the epitaxial layer 1. Then, an insulating film 9 is deposited over the resultant structure, and is anisotropically etched so that the insulating film 9 is exists only on an inner sidewall of the opening 7a. Then, an n-type polysilicon film 10 is formed and is patterned to cover the opening 7a, as illustrated in FIG. 1F. Then, the semiconductor substrate is thermally annealed to thereby make impurities contained in the n-type polysilicon film 10 diffuse into the base region 11 to thereby form an emitter region 13. The above mentioned thermal annealing carried out for the formation of the base region 11 makes p-type impurities contained in the polysilicon film 5 diffuse into the n-type epitaxial layer 1 through the polysilicon film 8 to thereby form external base regions 12.

The above mentioned conventional method needs seven photolithography steps to be carried out after the formation of the device isolation regions 3 in order to fabricate a bipolar transistor: (1) first for forming the opening BE in the silicon dioxide film 4 at a region where base/emitter are to be formed; (2) second for forming the opening C in the silicon dioxide film 4 at a region where a collector electrode is to be formed; (3) third for carrying out p-type impurities ion implantation into the polysilicon film 5 at a region where a base electrode is to be formed; (4) fourth for carrying out n-type impurities ion implantation into the polysilicon film 5 at a region where the collector region 6 is to be formed; (5) fifth for patterning the polysilicon film 5; (6) sixth for forming the base opening 7a through the silicon nitride film 7 and the polysilicon film 5; and (7) seventh for patterning the polysilicon film 10.

As mentioned above, the conventional method of fabricating a bipolar transistor in self-aligned fashion needs a lot of photolithography steps to be carried out, which increases the number of fabrication steps and lengthens the term for fabrication of a bipolar transistor. In addition, the increased number of fabrication steps is accompanied with problems of reduction in fabrication yield and increased fabrication cost.

SUMMARY OF THE INVENTION

It is an object of the present invention to provide a semiconductor device and a method of fabricating the same which are capable of decreasing the number of photolithography steps without sacrificing a high performance given to a bipolar transistor by a self-align process, to thereby decrease the number of fabrication steps and enhance fabrication yield.

In one aspect of the present invention, there is provided a method of fabricating a semiconductor device, including the steps of, in sequence, (a) partially forming a first conductivity type buried layer in a semiconductor substrate and also forming a first conductivity type epitaxial layer on the buried layer, (b) forming a collector region in the epitaxial layer by selectively introducing first conductivity type impurities into the epitaxial layer so that the collector region reaches the buried layer, (c) forming an insulating film on the epitaxial layer, (d) forming a second conductivity type impurities doped polysilicon film on the insulating film, (e) patterning the polysilicon film to form a base electrode, (f) forming an interlayer insulating film over the base electrode and the insulating film, (g) patterning both the interlayer insulating film and the base electrode to form a base opening at a region at which a base region is to be formed and a collector opening above the collector region, (h) side-etching portions of the insulating film located below the base electrode to form undercut hollow portions in the insulating film, (i) filling the undercut hollow portions with polysilicon, (j) forming a base region in the epitaxial layer by introducing second conductivity type impurities into the epitaxial layer through the base opening, (k) forming insulating sidewalls on inner walls of the base and collector openings, (l) forming a second conductivity type impurities doped polysilicon film over a resultant, and (m) patterning the second conductivity type impurities doped polysilicon film to form both an emitter electrode and the collector electrode.

In the above mentioned method, the step (j) may be carried out between the steps (g) and (h).

The above mentioned method may further include the step of (n) forming a dummy electrode above the collector region. The step (n) is to be carried out simultaneously with the step (e).

In the step (c), the insulating film is preferably formed to have thinner portions than other portions in regions at which the base electrodes and collector electrodes are to be formed. It is preferred that the thinner portion of the insulating film located above the collector region is situated within the collector opening.

There is further provided a method of fabricating a semiconductor device having a base region and an emitter region both of which are formed in self-aligned fashion with a base opening at which a base region is to be formed, comprising, at least, the steps of (a) forming a collector region in a semiconductor substrate prior to depositing an insulating film over the semiconductor substrate, and (b) forming a region at which a collector electrode is to be formed simultaneously with a region at which an emitter electrode is to be formed.

In another aspect of the present invention, there is provided a semiconductor device including (a) a semiconductor substrate, (b) a first conductivity type buried layer partially formed in the semiconductor substrate, (c) a first conductivity type semiconductor layer formed on the buried layer, (d) a second conductivity type base region formed in the semiconductor layer, (e) a collector region formed in the semiconductor layer, the collector region reaching the buried layer, (f) an interlayer insulating film formed over the semiconductor layer, the interlayer insulating film being formed with a first collector opening and a first base opening, (g) a base electrode formed below the interlayer insulating film and formed with a second base opening which has the same size as the first base opening and is in alignment with the first base opening, the base electrode being in contact with the base region, (h) a first insulating sidewall formed on inner walls of the first and second base openings, (i) a first conductivity type emitter region formed on a surface of the base region, (j) an emitter electrode formed over an inner surface of the first insulating sidewall, the emitter electrode being in contact with the emitter region, (k) a second insulating sidewall formed on an inner wall of the first collector opening, and (l) a collector electrode formed over an inner surface of the second insulating sidewall, the collector electrode being in contact with the collector region.

It is preferred that the second insulating sidewall is formed simultaneously with the first insulating sidewall, and that the collector electrode is formed simultaneously with the emitter electrode.

The interlayer insulating film may be designed to have thinner portions than other portions in regions at which the base electrodes and collector electrodes are to be formed.

The semiconductor device may further include a dummy electrode formed below the interlayer insulating film and formed with a second collector opening which has the same size as the first collector opening and is in alignment with the first collector opening. The dummy electrode is designed to be in contact with the collector region, and the second insulating sidewall covers inner walls of the first and second collector openings.

In accordance with the above mentioned present invention, it is possible to fabricate a bipolar transistor in self-aligned fashion using two less photolithography steps than the conventional method. Accordingly, the present invention makes it possible to fabricate a bipolar transistor in a fewer number of fabrication steps with a higher fabrication yield and smaller cost than the conventional method.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

Figure 1A:
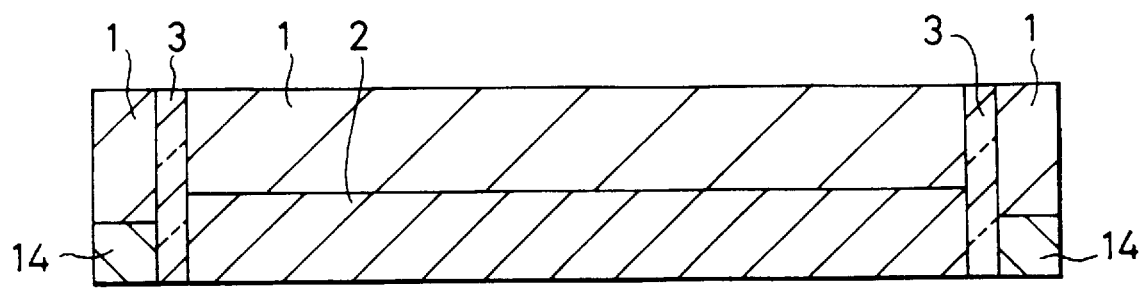
FIGS. 1A to 1F are cross-sectional views of a bipolar transistor, each drawing showing respective step of a conventional method of fabricating a bipolar transistor.
Figure 1B:
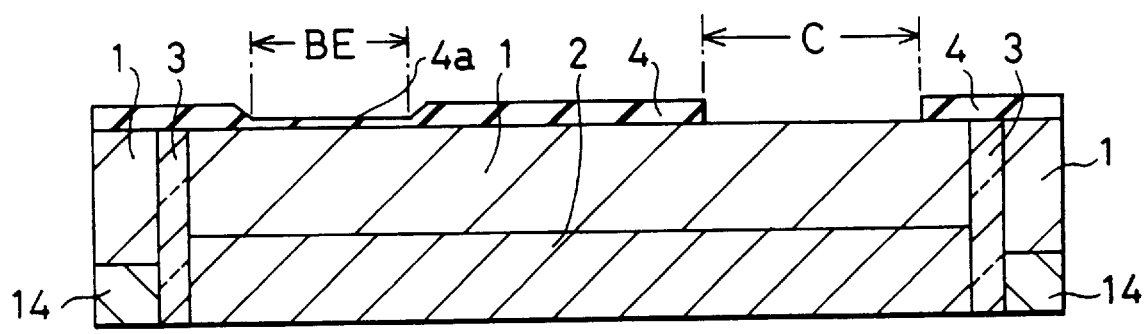
Figure 1C:
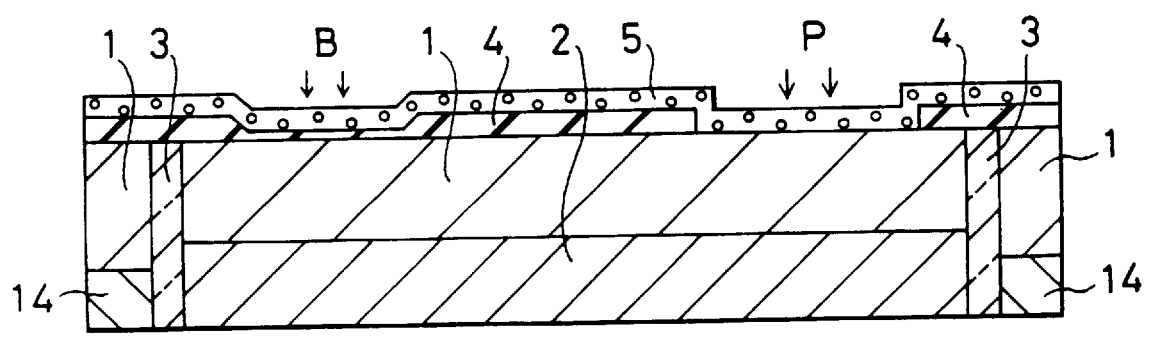
Figure 1D:
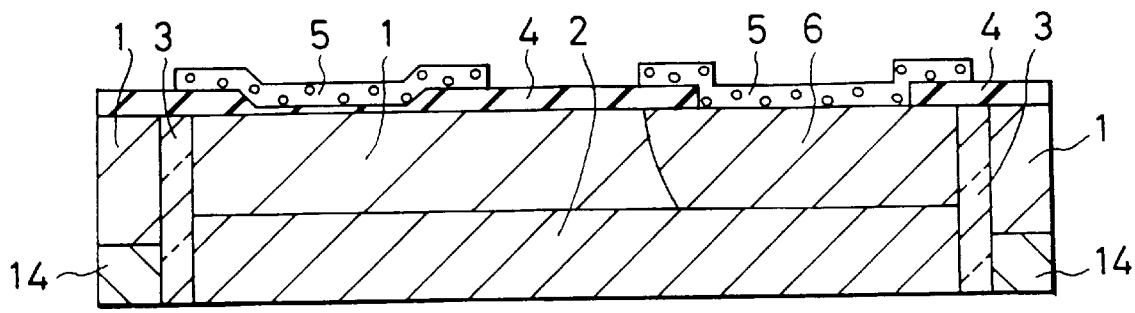
Figure 1E:
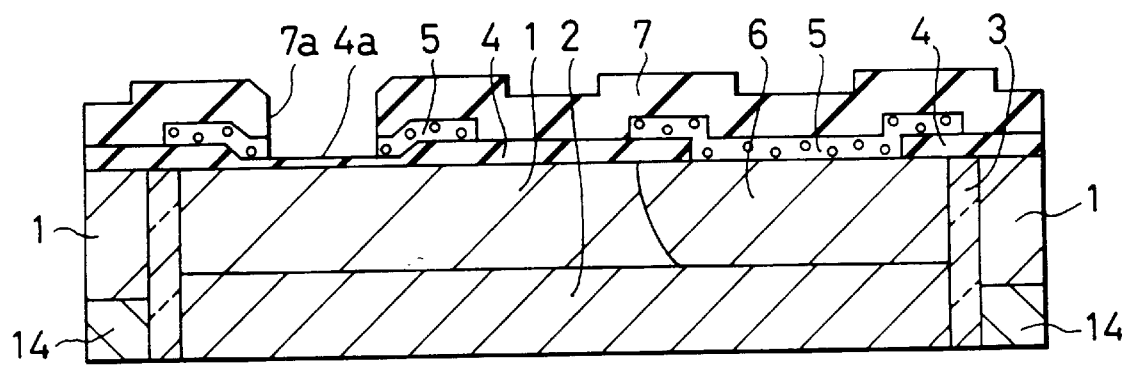
Figure 1F:
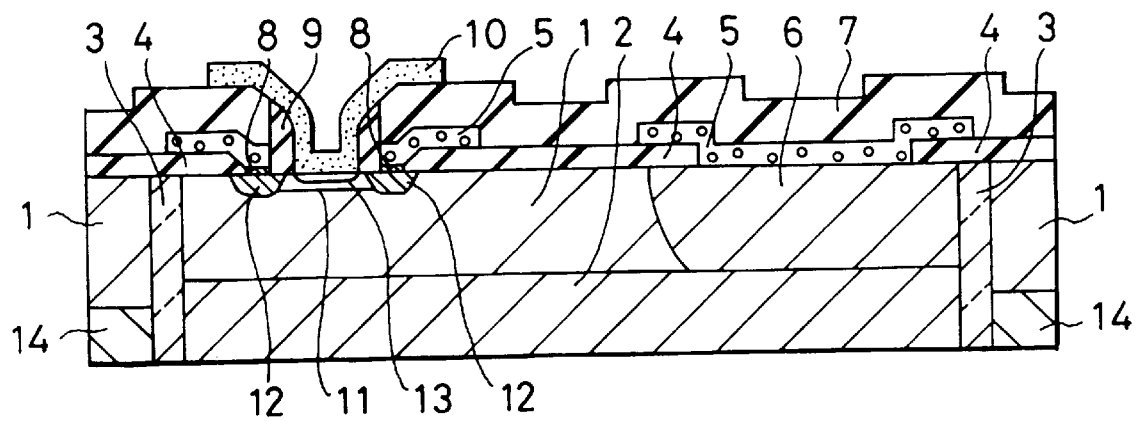
Figure 2A:
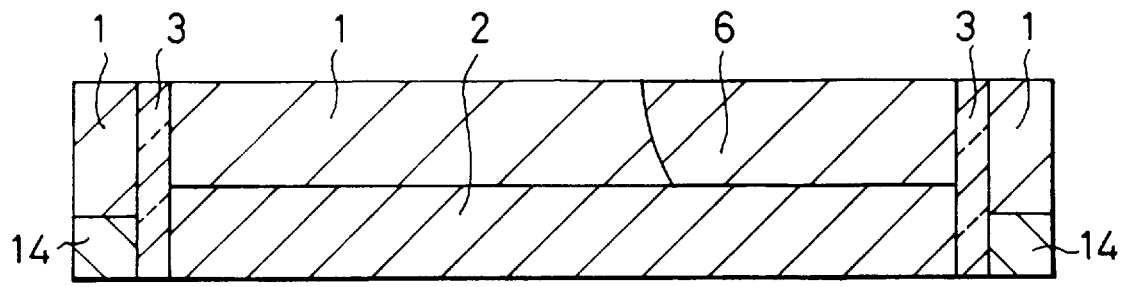
FIGS. 2A to 2F are cross-sectional views of a bipolar transistor, each drawing showing respective step of a method of fabricating a bipolar transistor to be carried out in accordance with the first embodiment of the present invention.

As illustrated in FIG. 2A, an n-type buried layer 2 is formed in a desired region in a p-type semiconductor substrate 14. After an n-type epitaxial layer 1 has been made to be grow over the semiconductor substrate 14, there are formed trench-type isolation regions 3 defining a region therebetween in which a semiconductor device is to be formed. Then, a first photolithography step is carried out. That is, phosphorus (P) ion implantation is carried out in the first lithography step into a selected region in the n-type epitaxial layer 1, for instance, at a dose of $5 \times 10^{15}$ cm$^{-2}$ at 70 KeV to thereby form a collector region 6 in the n-type epitaxial layer 1.

Figure 2B:
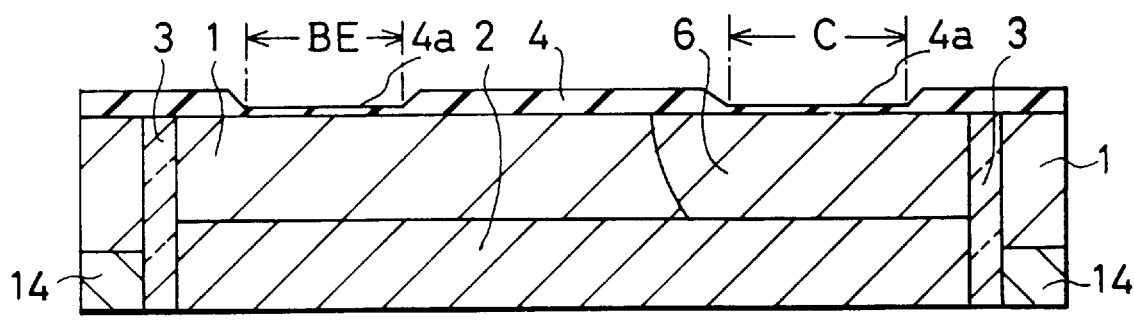

Then, a silicon dioxide film 4 is formed all over the resultant structure, by means of thermal oxidation or chemical vapor deposition (CVD). Then, a second photolithography step is carried out for forming a base/emitter opening BE at a region where base and emitter are to be formed and a collector opening C at a region where a collector electrode is to be formed. Then, the semiconductor substrate 14 is thermally annealed to thereby form thinner silicon dioxide films 4a than the first formed silicon dioxide film 4 within the base/ emitter opening BE and collector opening C, as illustrated in FIG. 2B.

Figure 2C:
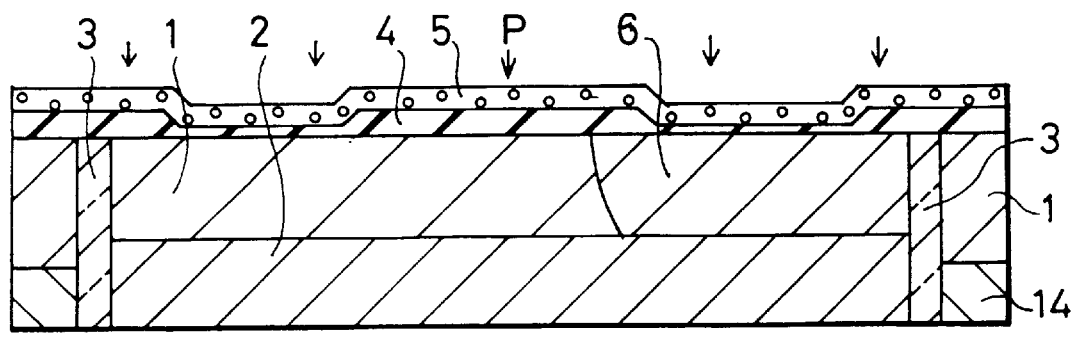
Figure 2D:
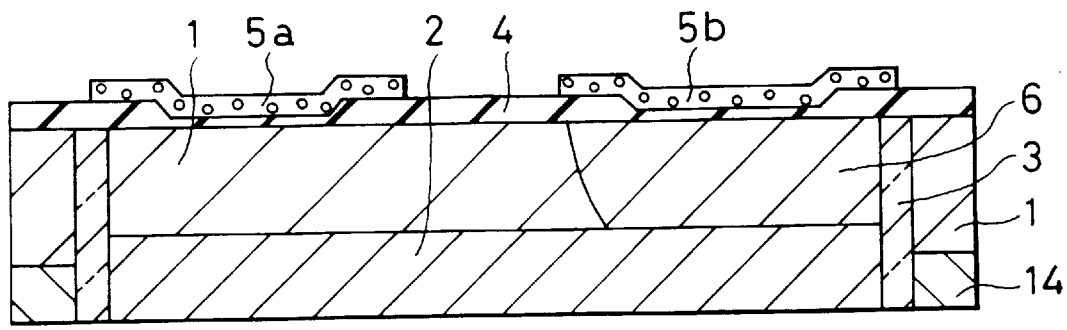

Then, as illustrated in FIG. 2C, a polysilicon film 5 is formed all over the silicon dioxide films 4 and 4a by means of CVD, followed by boron (B) ion implantation into the polysilicon film 5. Then, a third photolithography step is carried out. Specifically, the polysilicon film 5 is patterned by the third photolithography and further by etching to thereby form a base electrode 5a and a dummy electrode 5b both on the thinner silicon dioxide film 4a, each covering the base/emitter opening BE and collector opening C, respectively, as illustrated FIG. 2D.

Figure 2E:
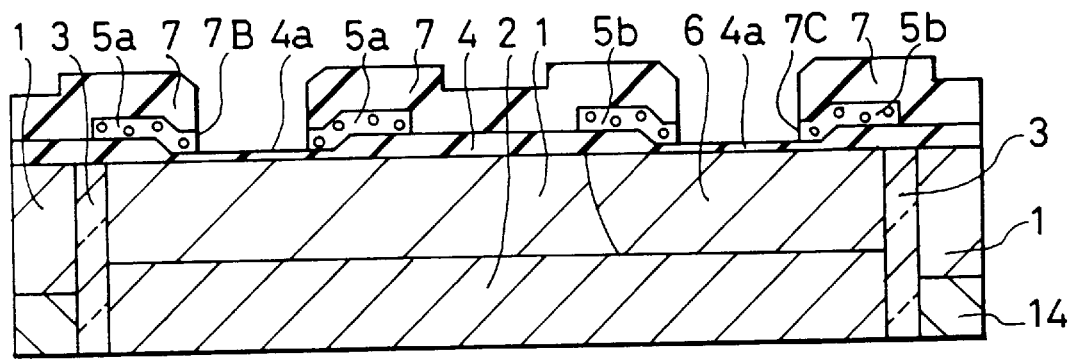

Then, a silicon nitride film 7 is deposited over a resultant by CVD. Then, a fourth photolithography step is carried out. That is, the silicon nitride film 7 and the polysilicon films 5a and 5b in regions where a base and a collector electrode are to be formed, respectively, are patterned in the fourth photolithography step and successively etched for removal to thereby form a base opening 7B and a collector opening 7C through which the thinner silicon dioxide films 4a are exposed, as illustrated in FIG. 2E.

Then, exposed portions of the thinner silicon dioxide films 4a and portions of the silicon dioxide film 4a located just below ends of the polysilicon films 5a and 5b are etched for removal with weak hydrofluoric acid to thereby form undercut hollow portions below the polysilicon films 5a and 5b. Then, a polysilicon film 8 is deposited in the base and collector openings 7B and 7C by CVD so that the undercut hollow portions are filled therewith. Then, the thus deposited polysilicon film 8 is etched out so that the polysilicon film 8 is existent only in the undercut hollow portions.

Then, boron ions are implanted into the epitaxial layer 1 at a dose of $2 \times 10^{13}$ cm$^{-2}$ at 10 KeV through the base and collector openings 7B and 7C, followed by thermal annealing to thereby form a base region 11 in the epitaxial layer 1 just below the base opening 7B. It should be noted that the collector region 6 has a high phosphorus concentration, and hence the collector region 6 is not inverted to p-type in spite of the above mentioned boron ion implantation.

Figure 2F:
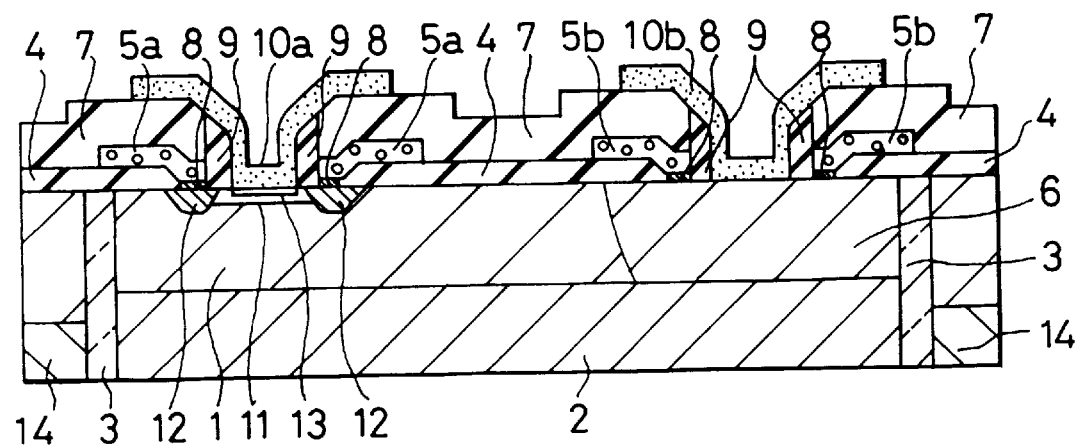

Then, an insulating film 9 is deposited, and is anisotropically etched so that the insulating film 9 exists only on inner sidewalls of the base and collector openings 7B and 7C. Then, an n-type polysilicon film is formed over a resultant, and is patterned to form an emitter electrode 10a covering the base opening 7B and a collector electrode 10b covering the collector opening 7C by means of a fifth photolithography step, as illustrated in FIG. 2F. Then, the semiconductor substrate is thermally annealed to thereby make impurities contained in the n-type polysilicon film 10a diffuse into the base region 11 to thereby form an emitter region 13 therein.

The above mentioned thermal annealing carried out after the formation of the polysilicon film 8, in particular, the thermal annealing carried out for the formation of the base region 11 makes p-type impurities contained in the polysilicon film 5a diffuse into the n-type epitaxial layer 1 through the polysilicon film 8 to thereby form external base regions 12 around the base region 11, as illustrated in FIG. 2F. Since the collector region 6 is designed to have a phosphorus concentration higher than a boron concentration, the above mentioned p-type impurities diffusion does not cause the collector region 6 to be inverted to a p-type one.

As is obvious in view of the foregoing description, the photolithography steps are carried out five times in order to fabricate a transistor after the formation of the device isolation regions 3. That is, the above mentioned first embodiment makes it possible to fabricate a transistor with the two smaller number of photolithography steps than the conventional method.

[Second Embodiment]

The method in accordance with the second embodiment has the same steps as those of the first embodiment having been explained with reference to FIGS. 2A to 2C. Accordingly, first and second photolithography steps have been already carried out in the second embodiment which is explained hereinbelow.

Figure 3A:
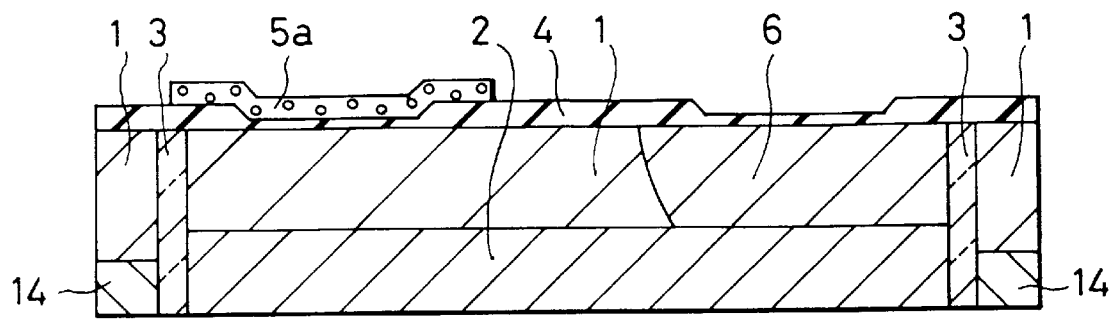
FIGS. 3A to 3C are cross-sectional views of a bipolar transistor, each drawing showing respective step of a method of fabricating a bipolar transistor to be carried out in accordance with the second embodiment of the present invention.

A polysilicon film is formed all over the silicon dioxide films 4 and 4a by means of CVD, followed by boron (B) ion implantation into the polysilicon film. Then, a third photolithography step is carried out. Specifically, the polysilicon film is patterned by the third photolithography and further by etching to thereby form a base electrode 5a on the thinner silicon dioxide film 4a, covering the base/emitter opening BE, as illustrated in FIG. 3A.

Figure 3B:
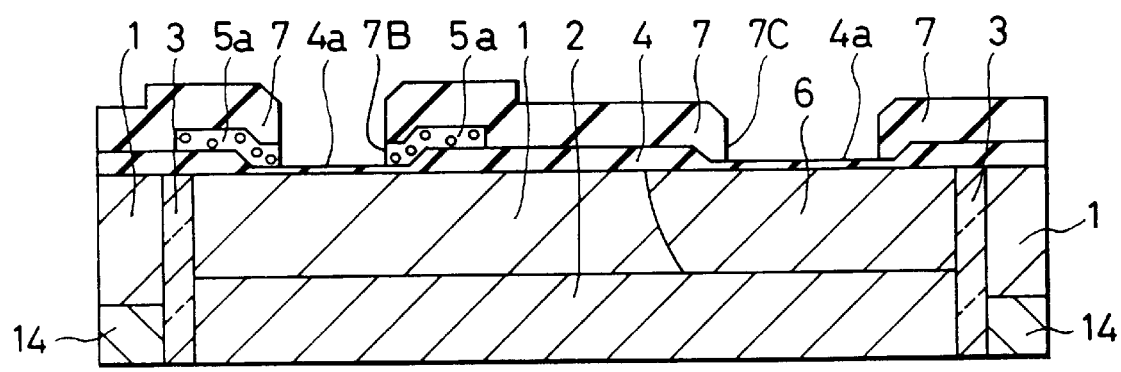

Then, a silicon nitride film 7 is deposited over a resultant by CVD. Then, a fourth photolithography step is carried out. That is, the silicon nitride film 7 and the polysilicon film 5a in regions where a base and a collector electrode are to be formed, respectively, are patterned in the fourth photolithography step and successively etched for removal to thereby form a base opening 7B and a collector opening 7C through which the thinner silicon dioxide films 4a are exposed, as illustrated in FIG. 3B.

Then, exposed portions of the thinner silicon dioxide films 4a and portions of the silicon dioxide film 4a located just below ends of the polysilicon film 5a are etched for removal with weak hydrofluoric acid to thereby form undercut hollow portions below the polysilicon film 5a. Then, a polysilicon film 8 is deposited in the base opening 7B by CVD so that the undercut hollow portions are filled therewith.

Then, boron ions are implanted into the epitaxial layer 1 at a dose of $2 \times 10^{13}$ cm$^{-2}$ at 10 KeV through the base and collector openings 7B and 7C, followed by thermal annealing to thereby form a base region 11 in the epitaxial layer 1 just below the base opening 7B.

Figure 3C:
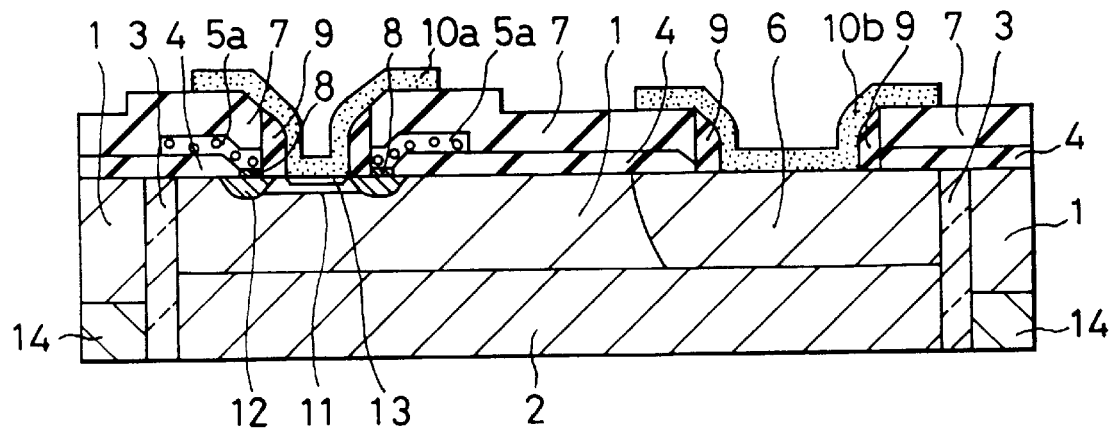

Then, an insulating film 9 is deposited over a resultant, and is anisotropically etched so that the insulating film 9 is existent only on inner sidewalls of the base and collector openings 7B and 7C. Then, an n-type polysilicon film is formed over a resultant, and is implanted with phosphorus. Then, the n-type polysilicon film is patterned to form an emitter electrode 10a covering the base opening 7B and a collector electrode 10b covering the collector opening 7C by means of a fifth photolithography step and etching, as illustrated in FIG. 3C. Then, the semiconductor substrate is thermally annealed to thereby make impurities contained in the n-type polysilicon film 10a diffuse into the base region 11 to thereby form an emitter region 13 therein.

Since boron contained in the polysilicon film 5 is not diffused into the collector region 6 in the above mentioned second embodiment, it is possible to make collector resistivity in a transistor smaller than that of the first embodiment.

It should be noted that the thinner portion 4a of the silicon dioxide film 4 located just above the collector region 6 may be formed also in the collector opening 7C in both the above mentioned first and second embodiments.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating a semiconductor device, comprising the steps of, in sequence:
   (a) partially forming a first conductivity type buried layer in a semiconductor substrate and also forming a first conductivity type epitaxial layer on said buried layer;
   (b) forming a collector region in said epitaxial layer by selectively introducing first conductivity type impurities into said epitaxial layer so that said collector region reaches said buried layer;
   (c) forming an insulating film on said epitaxial layer;
   (d) forming a second conductivity type impurities doped polysilicon film on said insulating film;
   (e) patterning said polysilicon film to form a base electrode;
   (f) forming an interlayer insulating film over said base electrode and said insulating film;
   (g) patterning both said interlayer insulating film and said base electrode to form a base opening at a region at which a base region is to be formed and a collector opening above said collector region;
   (h) side-etching portions of said insulating film located below said base electrode to form undercut hollow portions in said insulating film;
   (i) filling said undercut hollow portions with polysilicon;
   (j) forming a base region in said epitaxial layer by introducing second conductivity type impurities into said epitaxial layer through said base opening;
   (k) forming insulating sidewalls on inner walls of said base and collector openings;
   (l) forming a second conductivity type impurities doped polysilicon film over a resultant; and
   (m) patterning said second conductivity type impurities doped polysilicon film to form both an emitter electrode and said collector electrode.

2. The method as set forth in claim 1, wherein said step (j) is carried out between said steps (g) and (h).

3. The method as set forth in claim 1 further comprising the step of (n) forming a dummy electrode above said collector region, said step (n) being carried out simultaneously with said step (e).

4. The method as set forth in claim 2 further comprising the step of (n) forming a dummy electrode above said collector region, said step (n) being to be carried out simultaneously with said step (e).

5. The method as set forth in claim 1, wherein said insulating film is formed in said step (c) so that said insulating film has thinner portions than other portions in regions at which said base electrodes and collector electrodes are to be formed.

6. The method as set forth in claim 2, wherein said insulating film is formed in said step (c) so that said insulating film has thinner portions than other portions in regions at which said base electrodes and collector electrodes are to be formed.

7. The method as set forth in claim 5, wherein one of said thinner portions of said insulating film located above said collector region are situated within said collector opening.

8. The method as set forth in claim 6, wherein one of said thinner portions of said insulating film located above said collector region are situated within said collector opening.

9. A method of fabricating a semiconductor device having a base region and an emitter region both of which are formed in self-aligned fashion with a base opening at which a base region is to be formed, comprising, at least, the steps of:
   (a) forming a collector region in a semiconductor substrate prior to depositing an insulating film over said semiconductor substrate; and
   (b) forming a region at which a collector electrode is to be formed simultaneously with a region at which an emitter electrode is to be formed.

10. A method of fabricating a semiconductor device, comprising the steps of:
    (a) forming an epitaxial layer on a semiconductor layer, said epitaxial layer and said semiconductor layer both having a first conductivity;
    (b) forming a collector region in said epitaxial layer so that said collector region reaches said semiconductor layer, said collector region having said first conductivity;
    (c) forming a first insulating film except a first region located above said epitaxial layer and a second region located above said collector region;
    (d) forming a second insulating film on both said first and second regions;
    (e) forming a first electrically conductive layer on said second insulating film;
    (f) forming a third insulating film over said first electrically conductive layer and said first insulating film;
    (g) removing said second insulating film, said first electrically conductive film, and said third insulating film in selected areas to thereby form first and second contact holes;
    (h) forming a base region on said semiconductor layer with said first contact hole being used as a mask, said base region having a second conductivity;
    (i) forming a sidewall on inner walls of said first and second contact holes, said sidewall being constituted of an insulating film;
    (j) forming an emitter region in said base region having been formed in said first contact hole, said emitter region having said first conductivity; and
    (k) forming a second electrically conductive layer in both said first and second contact holes.

* * * * *